United States Patent [19]
Yamada et al.

[11] Patent Number: 5,443,646
[45] Date of Patent: Aug. 22, 1995

[54] METHOD AND APPARATUS FOR FORMING THIN FILM AND MULTILAYER FILM

[75] Inventors: Yuka Yamada; Katsuhiko Mutoh, both of Kanagawa, Japan

[73] Assignee: Matsushita Research Institute Tokyo, Inc., Kanagawa, Japan

[21] Appl. No.: 322,106

[22] Filed: Oct. 12, 1994

Related U.S. Application Data

[63] Continuation of Ser. No. 887,540, May 22, 1992, abandoned.

[30] Foreign Application Priority Data

Jun. 4, 1991 [JP] Japan .................................. 3-132635

[51] Int. Cl.6 ............................................. C23C 16/48
[52] U.S. Cl. ..................... 118/722; 118/699; 118/705; 118/708; 118/712; 118/50.1
[58] Field of Search ............... 118/699, 705, 722, 708, 118/712, 50.1

[56] References Cited

U.S. PATENT DOCUMENTS

| | | | |
|---|---|---|---|
| 4,435,445 | 3/1984 | Allred et al. | 427/54.1 |
| 4,836,140 | 6/1989 | Koji | 118/719 |
| 4,857,139 | 8/1989 | Tashiro et al. | 156/345 |
| 5,005,519 | 4/1992 | Egermeier et al. | 118/722 |
| 5,261,961 | 11/1993 | Takasu | 118/722 |

FOREIGN PATENT DOCUMENTS 62-22424  1/1987  Japan .................. 118/723

OTHER PUBLICATIONS

Appl. Phys. Lett., vol. 41, No. 11, Dec. 1, 1982 (Solanki et al).
Appl. Phys. Lett., vol. 43, No. 5, Sep. 1, 1983 (Solanki et al).

*Primary Examiner*—Richard Bueker
*Attorney, Agent, or Firm*—Dellett and Walters

[57] ABSTRACT

A thin film is formed on a substrate in a reaction chamber using a photo CVD technique by decomposing a reactive gas supplied to the reaction chamber by means of light irradiated through a light introducing window. The reduction in film deposition rate due to clouding of the light introducing window is corrected in order to form a thin film of a desired film thickness.

8 Claims, 4 Drawing Sheets

LIGHT IRRADIATION TIME DEPENDENCY
OF THE THICKNESS OF THIN FILMS

LIGHT IRRADIATION TIME DEPENDENCY
OF LIGHT INTENSITY INTRODUCED INTO
REACTION CHAMBER

METHOD AND APPARATUS FOR FORMING THIN FILM AND MULTILAYER FILM

This is a continuation of application Ser. No. 07/887,540 filed on May 22, 1992 now abandoned.

BACKGROUND OF THE INVENTION

The present invention relates to a method and an apparatus for depositing a thin film and a multilayer film using a photo-induced CVD (chemical vapor deposition) technique which is widely used in the industry.

The photo-induced CVD technique has been used to deposit various thin films or multilayer films. The photo-induced CVD technique has a problem in that a film is deposited on a window through which light is introduced into a reaction chamber during film deposition. The film deposited on the window decreases the intensity of the light irradiating the material gas in the reaction chamber through the window, thereby decreasing the film deposition rate at which the film is deposited onto a substrate. A conventional approach to solve this problem is blowing inert gasses such as argon, helium, etc. onto the window as disclosed, for example, in Japanese patent laid-open No. 183921/'86 or 169384/'88. Also, known is a method of etching the film deposited on the window by irradiating light of different wavelength disclosed in, for example, Japanese patent laid-open No. 263213/'86.

An example of the conventional technique to prevent the light introducing window from becoming clouded by blowing inert gas is described hereunder by reference to FIG. 7.

FIG. 7 is a configuration diagram of a conventional thin film depositing apparatus using a photo-induced CVD technique. In FIG. 7, represented by reference numerals 71, 72, 73, 74, 75, 76, 77 and 78 are a reaction chamber, a substrate holder, a substrate, an evacuation orifice, a reactive gas intake, light from a light source, a light introducing window, and a purging gas intake, respectively.

A film depositing process of the thin film depositing apparatus as constructed above will be described hereunder. Firstly, the substrate 73 on which a film is deposited is placed on the substrate holder 72 in the reaction chamber 71. The reaction chamber 71 is closed and evacuated through the evacuation orifice 74 to achieve high vacuum in the reaction chamber 71. The substrate 73 is then heated to a predetermined temperature before introducing a reactive gas into the reaction chamber 71 through the reactive gas intake 75. Subsequently, light 76 is irradiated through the light introducing window 77 to decompose the gas for deposition of a film on the substrate 73. Simultaneously, an inert gas is introduced through the purging gas intake 78 to prevent the reactive products from depositing on the light introducing window 77.

However, a disadvantage of the conventional system is incomplete prevention of clouding of the light introducing window due to the long time duration required for film deposition. This results in inaccurate film thickness and frequent replacement of the light introducing window. The problem is further exacerbated in applications using a large light introducing window for large-area film depositions and in applications using irradiation light with higher intensity.

On the other hand, if light intensity is not uniform over the light introducing window, the thin film deposited on the window varies in thickness, i.e., it is thicker at the area where light intensity is higher. This acts to correct the irregularity in light intensity to be introduced in the reaction chamber. However, the conventional apparatus is not controlled to utilize this type of effect.

The present invention intends to solve the above problems of the conventional apparatus. It is, therefore, an object of the present invention to provide a method and an apparatus for depositing a thin film and a multilayer film which compensates for the decrease in film deposition rate due to clouding of the light introducing window. It is another object of the present invention to provide a method and an apparatus for depositing a thin film in a manner overcoming non-uniformities in light intensity.

SUMMARY OF THE INVENTION

In order to achieve the above objects, the present invention includes means to vary the light irradiation time to obtain a desired film thickness as means to correct decrease in deposition rate due to clouding of the light introducing window when a thin film or a multilayer film is to be deposited by the photo-induced CVD technique. Additionally, there is provided means to perform the correction in a sequence-control method for simplifying the manufacturing steps.

Also, in order to deposit a thin film having a uniform film thickness by a photo-induced CVD technique, there is a correction step to correct irregularity in light intensity by simultaneously depositing a thin film on the light introducing window when a thin film is to be deposited on the substrate in the reaction chamber.

The present invention as constructed above is able to correct poor film thickness accuracy due to clouding of the light introducing window by a simple calculation so that a desired film thickness is obtained. In this way, the light introducing window need not be replaced as long as sufficient light for film depositing is irradiated into the reaction chamber. Also, the present invention does not limit expansion of the light introducing window for a larger film depositing area, an increase of density of the irradiation light, etc. Additionally, the sequence control simplifies the manufacturing process.

Any non-uniformity in the light intensity can be corrected to obtain a thin film of uniform and desired film thickness.

DETAILED DESCRIPTION OF PREFERRED EMBODIMENTS

Preferred embodiments of the present invention will be described in detail by reference to the accompanying drawings.

Described first is deposition of a monolayer thin film according to the present invention.

Figure 1:
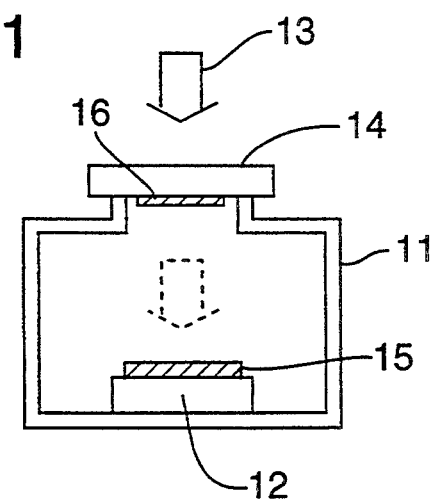
FIG. 1 is a schematic diagram illustrating the method of depositing a thin film of the present invention.

Illustrated in FIG. 1 is a schematic diagram explaining the method of depositing the thin film using a photo-induced CVD technique. In FIG. 1, the reference numeral 11 is a reaction chamber, 12 is a substrate, 13 is the light from a light source, and 14 is a light introducing window. Also, the reference numeral 15 represents a thin film deposited on the substrate 12 and 16 represents a thin film deposited on the light introducing window 14.

A film depositing process will be described in the thin film depositing apparatus as constructed above. Firstly, the substrate 12 is placed in the reaction chamber 11 for film depositing. The reaction chamber 11 is closed for evacuation to achieve a high degree of vacuum. The substrate 12 is then heated to a predetermined temperature and at least a reactive gas is introduced in the reaction chamber 11. Subsequently, the light 13 from a light source is irradiated through the light introducing window 14 to decompose the gas for film deposition on the substrate 12. When the light 13 is irradiated for a certain time, deposited on the substrate 12 is a thin film 15 and simultaneously a thin film 16 on the inner surface of the light introducing window 14. A part of the light 13 is absorbed by the thin film 16, and this reduces the light intensity to decompose the reactive gas in the reaction chamber 11.

The thickness of the films deposited on the window and the substrate is proportional to the light intensity, and proportionality factors are set to a and b. The light intensity $I_0$ from the light source is constant. The intensity of light introduced into the reaction chamber is a function of time (t) and is given by I(t) due to clouding of the light introducing window. The film thickness Dw(t) of the thin film deposited on the light introducing window is given by the following expression:

$$Dw(t) = a \int_0^t I(t)dt \quad (1)$$

$$I(t) = I_0 \exp(-\alpha \cdot Dw(t)) \quad (2)$$

where, $\alpha$ is the absorption coefficient of the film deposited on the window.

Also, the film thickness Ds(t) of the thin film deposited on the substrate is given by the following expression:

$$Ds(t) = b \int_0^t I(t)dt \quad (3)$$

From the above expressions (1) through (3), the following are obtained:

$$Dw(t) = \ln(a\alpha\, I_0 t + 1)/\alpha \quad (4)$$

$$Ds(t) = (b/a\alpha) \cdot \ln(a\alpha\, I_0 t + 1) \quad (5)$$

$$I(t) = I_0/(a\alpha\, I_0 t + 1) \quad (6)$$

Accordingly, the light irradiation time dependency of Ds(t) is studied in advance to determine the factors $b/a\alpha$ and $a\alpha\, I_0$ in the expression (5). In this manner, Ds(t) can be determined. This expression is used to calculate the irradiation time for a desired film thickness and the apparatus is controlled in a sequential manner.

First Embodiment

A first embodiment of the present invention will be described hereunder by reference to the accompanying drawings.

Figure 2:
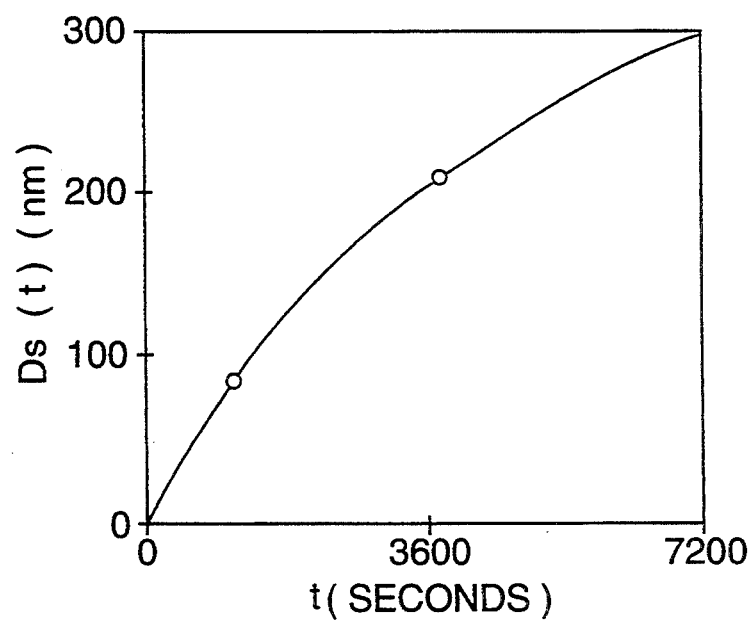
FIG. 2 is a graph illustrating light irradiation time dependency of the carbon film thickness in the first embodiment of the present invention.
Figure 7:
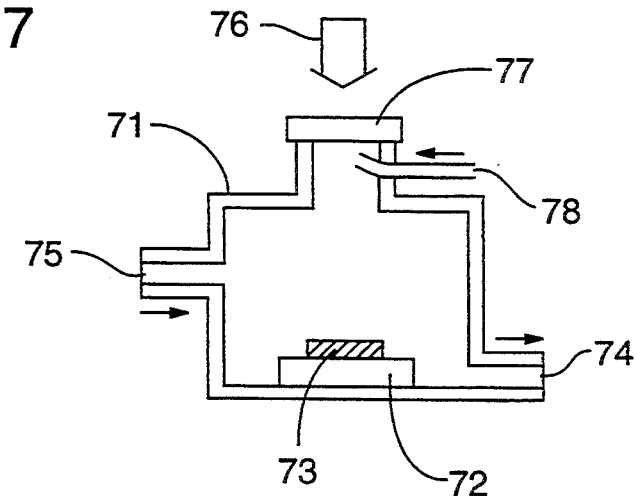
FIG. 7 is a schematic diagram of the conventional thin film depositing apparatus.

In the first embodiment of the present invention, an irradiation time dependency of a carbon film thickness deposited on a Si(silicon) substrate is studied by using an excimer-laser-induced CVD technique. A construction of the apparatus used for the carbon film forming is similar to the apparatus as illustrated in FIG. 7. A method of depositing the thin film is also similar to the conventional method as described hereinbefore. An ArF excimer laser with a wavelength of 193 nm is used as the light source. Benzene and helium gasses are used as the reactive gas and the purging gas, respectively. FIG. 2 is a graph illustrating the irradiation time dependency of the carbon film thickness. Black dots represent the measured values and the solid line represents the result calculated from the expression (5) to fit the measured values, and is given by the following expression:

$$Ds(t) = 195 \cdot \ln(0.000492t + 1) \quad (7)$$

It is to be noted that units for t and Ds(t) are seconds and nm.

Using the above calculated values, a carbon film of a given thickness was first deposited with a non-clouded window and then additional carbon films of the same film thickness were successively deposited without replacing the window but by controlling the light irradiation time. As understood from this result, the method of depositing the thin film according to the present invention is effective to deposit thin films of desired film thickness without being affected by the degree of clouding of the window.

According to the above embodiment, in forming a thin film using the photo-induced CVD technique, thin films of desired film thickness are effectively deposited by the provision of a step of sequence control to vary the light irradiation time so as to compensate for the reduced deposition rate due to clouding of the window.

Now, an example of depositing a multilayer film is described.

In addition to the steps of depositing a monolayer thin film as described above, light irradiation time is separately controlled for each film of such multilayer film because each thin film constituting the multilayer film has different properties (deposition rate, absorption coefficient, etc.). In case of depositing a multilayer film composed of two alternately deposited two kinds of films, a process of calculating the light irradiation time is described hereunder by reference to the drawings.

Figure 3A:
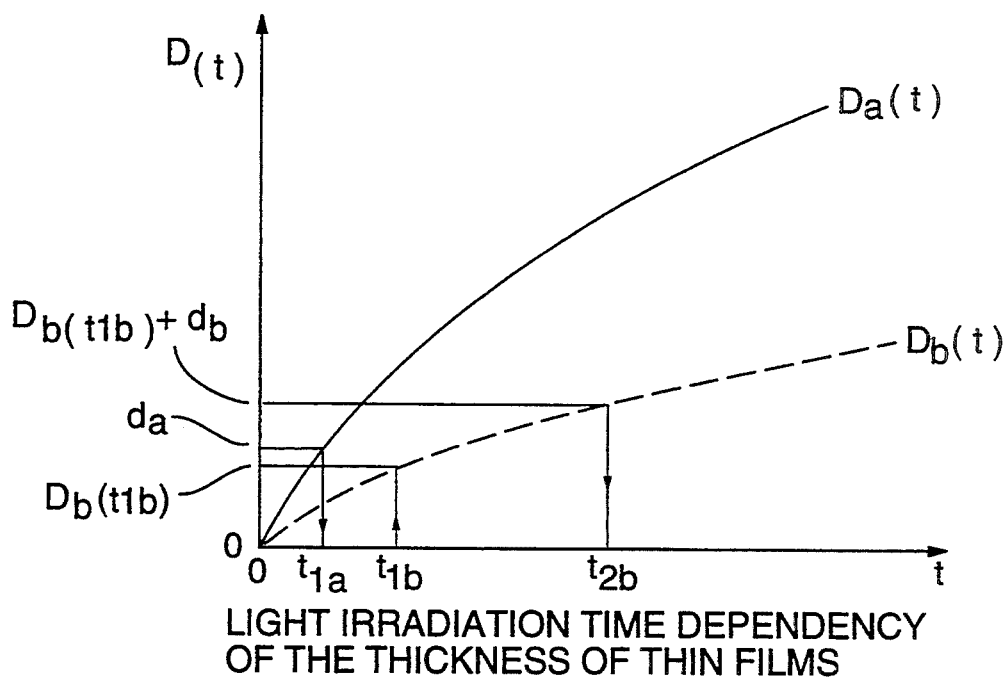
FIG. 3(a) is a graph illustrating light irradiation time dependency of the thicknesses of both films A and B constituting the multilayer film in the process of calculating light irradiation time in the multilayer film depositing of the present invention.
Figure 3B:
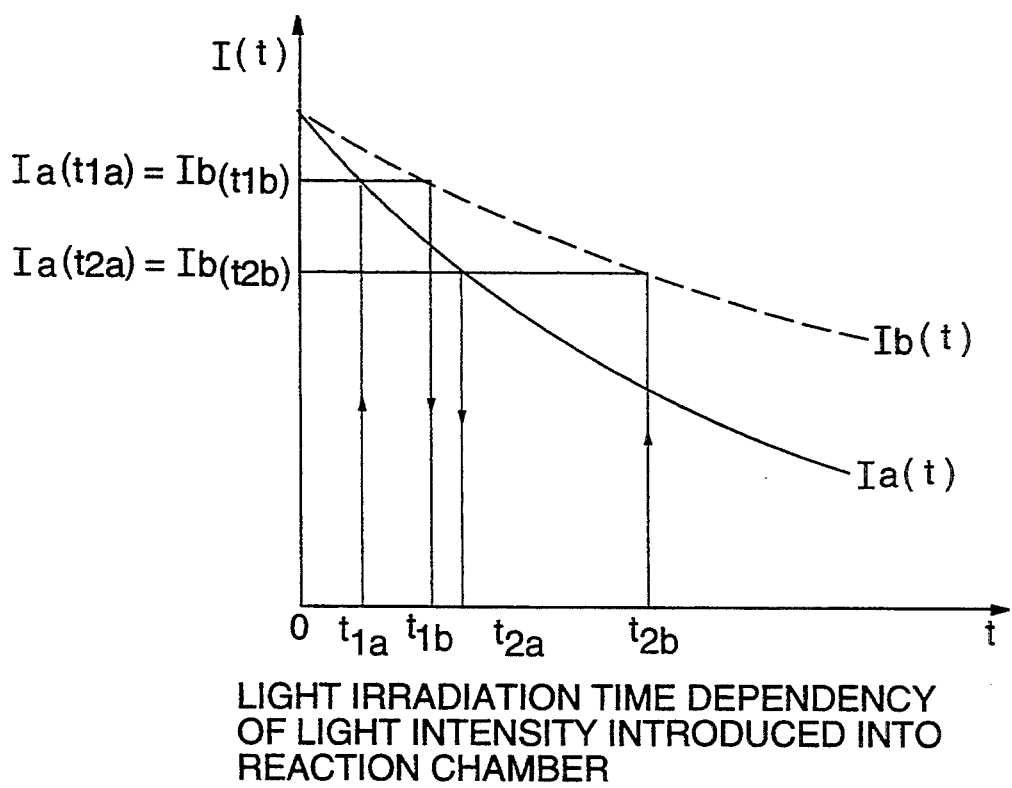
FIG. 3(b) is a graph illustrating light irradiation time dependency of the light intensity to be introduced in the reaction chamber for separately depositing films A and B in the process of calculating the light irradiation time for multilayer film depositing of the present invention.

Firstly, light irradiation time dependency of the thickness of the two kinds of thin films A and B constituting the multilayer film is studied prior to multilayer film depositing for determining the factors in the above expression (5) for each film. As a result, it is assumed that Ds (t) for both films A and B are obtained as $D_a$(t) and $D_b$ (t) as illustrated in FIG. 3(a). When the films A and B are deposited separately, the light intensities $I_a$(t) and $I_b$ (t) introduced into the reaction chamber are given by the above expression (6) and vary as illustrated in FIG. 3(b). In depositing the multilayer film, the light irradiation time ($t_{1a}$) required to deposit the first layer film A to a predetermined thickness ($d_a$) is determined and $I_a(t_{1a})$ at that time is also obtained. Then, the time equal in light intensity to $I_a(t_{1a})$ for the film B, or $t_{1b}$ to realize $I_a(t_{1a}) = I_b(t_{1b})$ is calculated and also the film thickness $D_b(t_{1b})$ of the film B at this time is obtained. The light irradiation time ($t_{2b}$) to obtain the film thickness $D_b(t_{1b}) + d_b$ for the second layer film B of the film thickness $d_b$ is calculated and the second layer film B is deposited by irradiating the light for the time $t_{2b}-t_{1b}$. The light irradiation time is sequentially determined in the similar manner to deposit the multilayer film with each layer having a predetermined thickness.

In case of depositing a multilayer film composed of 3 or more kinds of films, it is understood that factors of the above expression (5) are determined for each film, and then, the light irradiation time for each layer is calculated in the same manner as above.

Second Embodiment

Now, a second embodiment of the present invention will be described.

A tungsten-carbon multilayer film (referred to as W/C multilayer film below) is deposited by an excimer-laser-induced CVD technique using the above calculation procedure of the irradiation time for depositing the above multilayer film. The apparatus used for depositing the W/C multilayer film has essentially the same construction as that in FIG. 7. An ArF excimer laser is used as the light source. Tungsten hexafluoride and benzene are used as the reactive gases and helium as the purging gas. Firstly, the irradiation time dependency of the film thicknesses dw(t) and dc(t) for the tungsten and carbon films are studied in the similar manner to the first embodiment to obtain the factors as follows:

$$dw(t) = 182 \cdot ln(0.000352t + 1) \quad (8)$$

$$dc(t) = 195 \cdot ln(0.000492t + 1) \quad (9)$$

In either case of the above expressions, units for the time and film thickness are seconds and nm, respectively.

The irradiation time for each layer of the multilayer film was determined by the above calculation procedure using the expressions (8) and (9), and the multilayer film was deposited using this result.

Figure 4A:
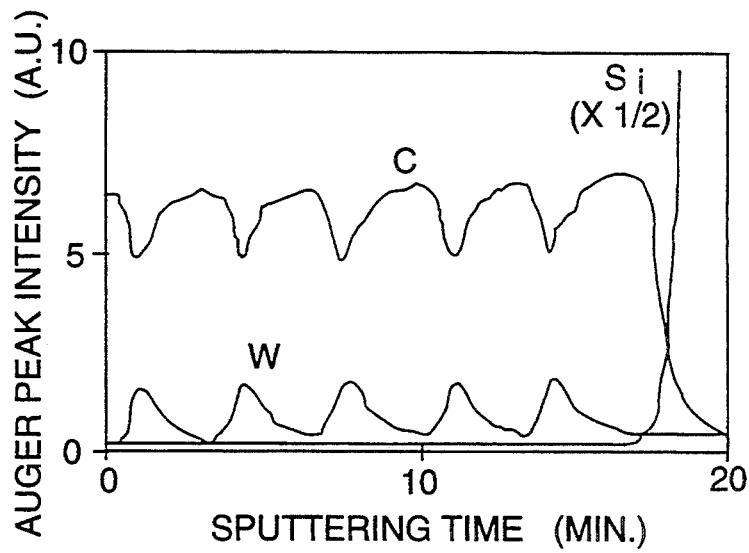
FIG. 4(a) is a graph illustrating the result of Auger electron spectroscopy measurement of the W/C multilayer film in the second embodiment of the present invention.
Figure 4B:
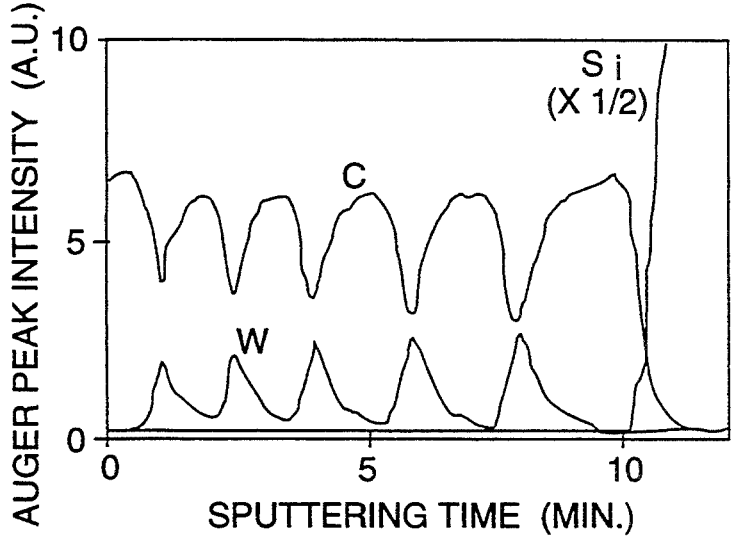
FIG. 4(b) is a graph illustrating the result of Auger electron spectroscopy measurement of the W/C multilayer film deposited using the conventional technique.

FIG. 4(a) shows the result from an Auger electron spectroscopy measurement of the W/C multilayer film in the second embodiment of the present invention. FIG. 4(b) shows the result from an Auger electron spectroscopy measurement of the W/C multilayer film with each layer formed by irradiating the light for a constant time using the same apparatus. The horizontal axis represents the sputtering time which is proportional to the film thickness. In the drawings, Si represents the substrate on which C (carbon) and W (tungsten) films are deposited alternately. As apparent from FIG. 4(b) of the conventional technique, the film thickness decreases with an increase in the layer number. For example, the thickness of the fifth C layer is about 60% of that of the first C layer. On the other hand, in FIG. 4(a) for the multilayer film deposited in accordance with the second embodiment of the present invention, the thickness of the first through fifth layers are essentially the same.

It is now obvious from the above description that sequential control of the light irradiation time during the thin film deposition of the multilayer film enables accurate control of the thickness of each layer.

Although the excimer-laser-induced CVD technique is used in the first and second embodiments, it is understood that another light source such as a low pressure mercury lamp or the like may be used as the light source. Also, the present invention is effective to deposit thin films and multilayer thin films other than carbon films, tungsten films and W/C multilayer films.

Figure 5:
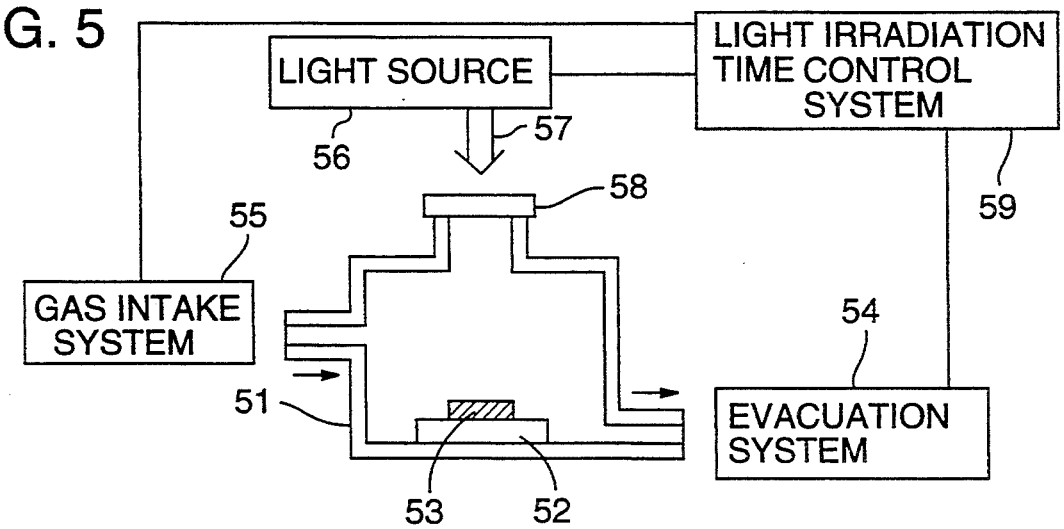
FIG. 5 is a schematic diagram of the thin film depositing apparatus in the present invention.

A thin film depositing apparatus including means to control the light irradiation time in the first and second embodiments may be constructed, for example, as shown in FIG. 5. In FIG. 5, represented by reference numerals 51, 52, 53, 54, 55, 56, 57, 58 and 59 are a reaction chamber, a substrate holder, a substrate, an evacuation system, a gas intake system, a light source, a light beam from the light source 57, a light introducing window, and a light irradiation time control system, respectively.

A thin film depositing process will be described hereunder by reference to the above thin film depositing apparatus. The substrate 53 on which a film is depositing is first placed on the substrate holder 52 in the reaction chamber 51. The reaction chamber 51 is closed and evacuated by the evacuation system 54 to achieve a high degree of vacuum within the reaction chamber 51. The substrate 53 is, then, heated to a predetermined temperature before introducing the reactive gas into the reaction chamber 51 from the gas intake system 55. Subsequently, the light beam 57 from the light source 56 is irradiated through the light introducing window 58 to decompose the gas for deposition of a thin film on the substrate 53. The series of operations are controlled by the light irradiation time control system 59 to deposit a thin film of a desired thickness.

Finally, studied is non-uniformity in light intensity passing through the light introducing window.

If there is any non-uniformity in light intensity, the deposited film tends to be thicker at the higher intensity portion of the light. However, the thin film to be deposited on the light introducing window will be thicker at that portion, thereby decreasing the light intensity passing through the window because more light is absorbed in the thin film. This acts to deposit a uniform thin film on the substrate. It is therefore possible to correct non-uniformity in light intensity and deposit a uniform thin film of desired film thickness by controlling the ratio of film thickness of the thin films deposited on the substrate and the light introducing window and also the light irradiation time.

Third Embodiment

A third embodiment of the present invention will be described hereunder by reference to the accompanying drawings.

Figure 6A:
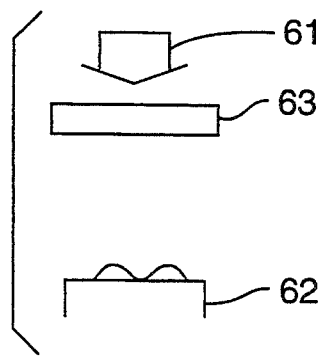
FIGS. 6(a)–6(c) illustrates steps of the thin film depositing method in a third embodiment of the present invention.
Figure 6B:
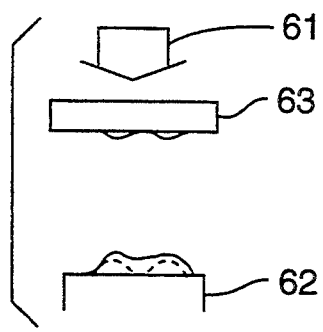
Figure 6C:
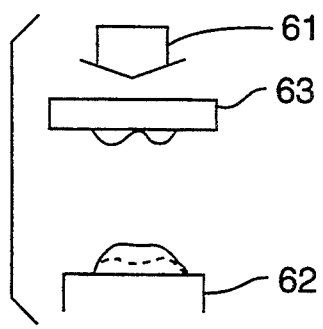

FIGS. 6(a)–6(c) show steps of the method of depositing a thin film according to the third embodiment of the present invention. In FIGS. 6(a)–6(c), represented by the reference numerals 61, 62, and 63 are a light, a substrate and a light introducing window. The intensity of the light 61 is non-uniform in this particular instance. In the above construction, when the non-uniform light 61 is irradiated, a thin film is deposited on the substrate 62 (FIG. 6(a)). It is to be noted here that thicker thin film is deposited at higher intensity portions of the light 61, thereby causing non-uniform thin film as shown in the figure. However, the continued irradiation of the light 61 will lead to deposit of a similarly non-uniform thin film on the light introducing window 63, thereby absorbing the light to decrease the light intensity passing through the window. This affects more at the portion where the thicker film is deposited, i.e., at the higher intensity portion of the light from the light source. Accordingly, the thin film on the window helps to correct the non-uniformity of the thin film to be deposited on the substrate (FIG. 6(b)). Continued irradiation of the light will lead to the deposit of the thin film of uniform film thickness on the substrate (FIG. 6(c)).

It is now understood that optimizing the ratio of thickness of the thin films to be deposited on the substrate and the light introducing window will be effective in depositing a uniform thin film on the substrate.

What is claimed is:

1. A thin film depositing apparatus using a photo-induced CVD technique for depositing a thin film having a desired film thickness on a substrate in a reaction chamber by introducing a reactive gas and irradiating light through a light introducing window into the reaction chamber to decompose the reactive gas, characterized by the provision of means for studying the standard clouding characteristics of the light introducing window in advance of depositing film on the substrate, and determining the time duration of light irradiation for film deposition on the substrate depending on the current degree of clouding of the light introducing window by reference to the standard clouding characteristics, thereby accommodating a reduced deposition rate due to said clouding, enabling the deposition of the thin film of the desired film thickness.

2. A thin film depositing apparatus according to claim 1 wherein said means for determining the time duration is operative to sequentially affect the light irradiation duration in accordance with respective current amounts of window clouding and the desired film thickness.

3. A multilayer film depositing apparatus for depositing a multilayer film composed of at least two kinds of thin films alternately deposited using a photo-induced CVD technique depositing the respective thin films of associated desired film thicknesses within a reaction chamber by sequentially introducing in order corresponding reactive gases and irradiating light through a light introducing window into the reaction chamber to decompose the corresponding reactive gases, characterized by the provision of means for studying the standard clouding characteristics of the light introducing window in advance of depositing film on the substrate, and determining the time duration of light irradiation for film deposition on the substrate depending on the current degree of clouding of the light introducing window by reference to the standard clouding characteristics, thereby accommodating respective reduced deposition rates thereof due to the clouding, enabling the formation of the alternately deposited thin films.

4. A multilayer film depositing apparatus according to claim 3 wherein said determining means is operative for sequentially and separately determining the respective current amount of the clouding of the light introducing window before each thin film deposition and providing a light irradiation duration for said each thin film deposition in accordance with the respective current amount determined and the associated desired film thickness.

5. An apparatus for depositing a first thin film of a desired first thickness upon a substrate, said apparatus comprising:

a chamber containing reactive gas of a first type and having a light introducing window for permitting light to enter the chamber with said substrate disposed within;

irradiation means for irradiating light upon the light introducing window and supplying light within the chamber for depositing a film, as said first thin film, on said substrate as the light decomposes the reactive gas of the first type at a rate determined by the reactive gas of the first type and by light intensity; and control means for studying the standard clouding characteristics of the light introducing window in advance of depositing film on the substrate, and determining the time duration of light irradiation for film deposition on the substrate depending on the current degree of clouding of the light introducing window by reference to the standard clouding characteristics.

6. An apparatus according to claim 5 wherein said control means establishes a time duration for the irradiation of light by said irradiation means in accordance with the first current amount of film accumulation on the light introducing window and said desired first thickness, for providing said first thin film of substantially said desired first thickness upon said substrate.

7. An apparatus according to claim 5 wherein said control means has means for controlling the intensity of the light irradiated by said irradiation means in accordance with the first current amount of film accumulation on the light introducing window and said desired first thickness.

8. An apparatus according to claim 5 further comprising:

means for purging the chamber of the reactive gas of the first type; and means for supplying the chamber a reactive gas of a second type, wherein a second thin film is deposited upon said first thin film deposited on said substrate by again passing light of the irradiation means through said light introducing window into the chamber and decomposing the reactive gas of the second type at a rate determined by the reactive gas of the second type and intensity of said light;

wherein said control means determines a second current amount of film accumulation of said light introducing window from the light energy transmitted through said light introducing window and the reactive gas of the first type during the first thin film deposition and the light energy to be transmitted through said light introducing window and the reactive gas of the second type for providing the second film deposition, and affects the second thin film deposition by determining the time duration of light irradiation in accordance with the second current amount of said amount of film accumulation on the light introducing window and a desired second thickness of the second film deposition for enabling the formation of a multilayer film structure on said substrate.

* * * * *